(12) United States Patent
Guo et al.

(10) Patent No.: US 7,868,346 B2
(45) Date of Patent: Jan. 11, 2011

(54) ISLAND SUBMOUNT AND A METHOD THEREOF

(75) Inventors: Yih-Der Guo, Hsinchu (TW); Jenq-Dar Tsay, Hsinchu (TW); Po-Chun Liu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 134 days.

(21) Appl. No.: 11/948,464

(22) Filed: Nov. 30, 2007

(65) Prior Publication Data

US 2009/0085050 A1 Apr. 2, 2009

(30) Foreign Application Priority Data

Sep. 28, 2007 (TW) .............................. 96136445 A

(51) Int. Cl.
*H01L 33/48* (2010.01)
(52) U.S. Cl. .......... 257/99; 257/E33.056; 257/E33.066; 438/26
(58) Field of Classification Search ................. 257/676, 257/99, 88, 98, 100, E33.055, E33.056, E33.057, 257/E33.058, E33.066, E33.072, E33.062, 257/E33.065; 438/26, 34, 39
See application file for complete search history.

(56) References Cited

U.S. PATENT DOCUMENTS

2005/0051789 A1* 3/2005 Negley et al. ................. 257/99
2005/0274970 A1 12/2005 Ludowise
2007/0029570 A1* 2/2007 Shin et al. ..................... 257/99
2008/0006837 A1* 1/2008 Park et al. ..................... 257/98
2008/0030139 A1* 2/2008 Shiraishi et al. ............... 315/32
2008/0087902 A1* 4/2008 Lee et al. ...................... 257/88

OTHER PUBLICATIONS

SIPO; Office Action in related foreign application (TW 096136445) to which priority is claimed by the present application; Jan. 8, 2010.

* cited by examiner

*Primary Examiner*—Victor A Mandala
*Assistant Examiner*—Scott Stowe
(74) *Attorney, Agent, or Firm*—Workman Nydegger

(57) ABSTRACT

An island submount used for carrying at least one light-emitting element having at least one electrical contact. The island submount includes a substrate, at least one island structure having a top surface and an inclined surface, and a conductive layer. The island structure is located on the substrate and corresponds to the electrical contact. The conductive layer is formed on the surface of the island structure and at least covers the top surface, so as to be electrically connected with the electrical contact. The island submount is capable of enhancing the light extraction efficiency of the light-emitting element, and avoids the energy loss due to re-absorption when the light emerging from below the light-emitting element is reflected back to the light-emitting element.

25 Claims, 16 Drawing Sheets

ISLAND SUBMOUNT AND A METHOD THEREOF

CROSS-REFERENCE TO RELATED APPLICATIONS

This non-provisional application claims priority under 35 U.S.C. §119(a) on Patent Application No(s). 0961364445 filed in Taiwan, R.O.C. on Sep. 28, 2007, the entire contents of which are hereby incorporated by reference.

BACKGROUND OF THE INVENTION

1. Field of Invention

The present invention relates to a submount, and more particularly to a submount having an island structure used for carrying a light-emitting element.

2. Related Art

The light-emitting principle of light-emitting diodes (LEDs) is to form a p-n junction with different doping modes. When electrons and holes are combined, the energy is released in the form of light, and the light is substantially a set of infinite multi-point light sources. LEDs are advantageous in high durability, long service life, light weight, and low power consumption. Besides, LEDs do not contain hazardous substances like mercury. Therefore, the illumination market has a high expectation on LEDs.

The light-emitting efficiency of LEDs is generally referred to as the external quantum efficiency (EQE) of an element, which is a product of the internal quantum efficiency (IQE) and light extraction efficiency (LEE) of the element. The IQE of an element is actually the electric-optical conversion efficiency of the element, which is mainly relevant to the characteristics of the element, such as the energy band, defects and impurities of the material of the element, as well as the expitaxy composition and structure of the element. The LEE of an element is the number of the photons generated inside the element that can be actually measured outside the element after being absorbed, refracted, and reflected by the element. Thus, factors related to the LEE includes the absorption coefficient and refractive index of the material of the element, the geometrical structure and surface roughness of the element, the refractive index difference between the element and the packaging material, and the type of the element packages, and so on. The product of the above two efficiencies is the light-emitting effect of the entire element, i.e., the EQE of the element.

Besides the prior art of face-up architecture, the face-down flip-chip type packages are the main trend of the future development, since the face-down flip-chip type packages can significantly improve the heat dissipation and light extraction effect. Currently, the flip-chip architecture may be classified into to two popular types including the thin film LED and the flip-chip LED. The thin film LED is mainly formed by turning over an expitaxy layer plated with a reflective layer to be fixed to a submount by a connection layer, and then stripping the growth substrate and roughening its upper surface. The flip-chip LED has a similar architecture as the above thin film LED. The main difference therebetween is that the flip-chip LED is fixed onto a submount through a plurality of metal balls, and thus a space for emerging light is formed between the expitaxy layer and the submount, so as to reduce the amount of absorption of the light emerging from below the flip-chip LED when being reflected back to the flip-chip LED.

FIG. 1 is a schematic view of a prior art flip-chip architecture. Referring to FIG. 1 the prior art of flip-chip architecture uses a metal ball 12 to fix a light-emitting element 11 onto a submount 13. However, the light emerging from below the light-emitting element 11 may still enter the light-emitting element 11 after being reflected by the surface of the submount 13, thus resulting in re-absorption and weakening the energy of the output light at last.

SUMMARY OF THE INVENTION

To avoid the absorption of the light from below the light-emitting element to reflect back to the light-emitting element, the present invention provides an island submount which is a substrate having an island structure and a method thereof.

The island submount of the present invention is used for carrying at least one light-emitting element having at least one electrical contact. The island submount includes a substrate, at least one island structure having a top surface and an inclined surface, and a conductive layer. The at least one island structure is located on the substrate and corresponding to at least one electrical contact of the light-emitting element. The top surface of the island structure is corresponding to the electrical contact of the light-emitting element, and the inclined surface of the island structure is used to reflect and guide the light emerging from below the light-emitting element to be emitted from the side. The conductive layer is formed on the surface of the island structure and at least covers the top surface, and is electrically connected to the electrical contact of the light-emitting element.

A method for fabricating an island submount, wherein the island submount is used to carry at least one light-emitting element having at least one electrical contact, the fabrication method comprising providing a substrate, forming at least one island structure having a top surface and an inclined surface, wherein the island structure is corresponding to the electrical contact, forming a conductive layer on the substrate, wherein the conductive layer at least covers the top surface, and connecting the conductive layer covered with the top surface to the electrical contact.

The island submount and the method thereof of the present invention is used to guide the light from below the light-emitting element to be emitted from the side, so as to avoid re-absorption when the light is reflected back to the light-emitting element, thus enhancing the overall LEE of the light-emitting element.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The features and practice of the present invention will be illustrated in detail below with the accompanying drawings.

Figure 1:
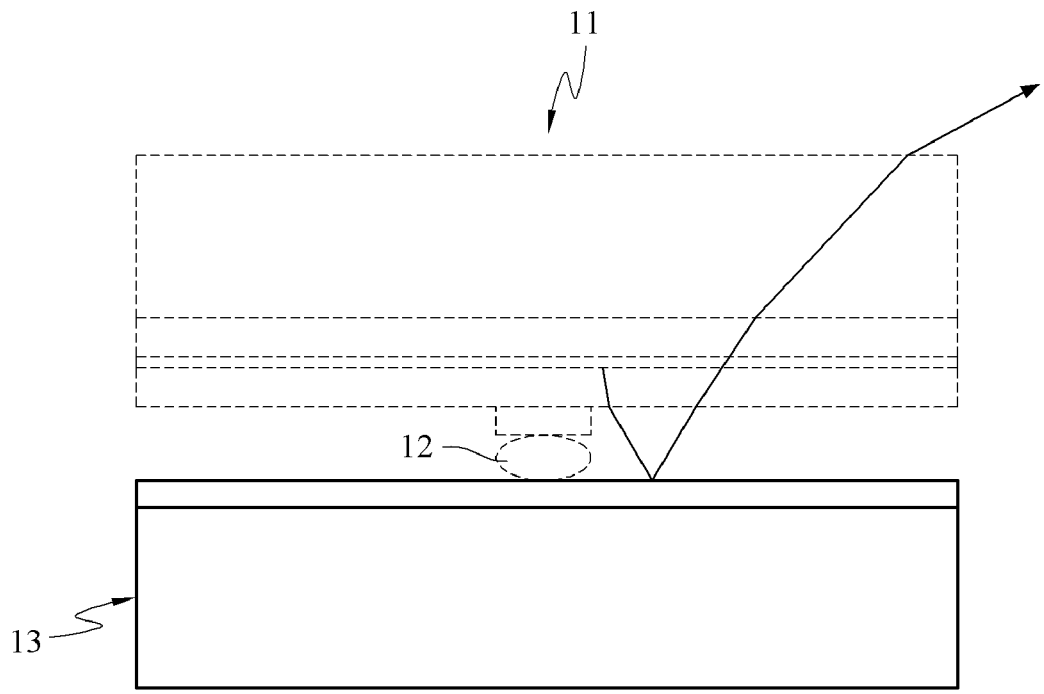
FIG. 1 is a schematic view of a prior art of flip-chip architecture.
Figure 2:
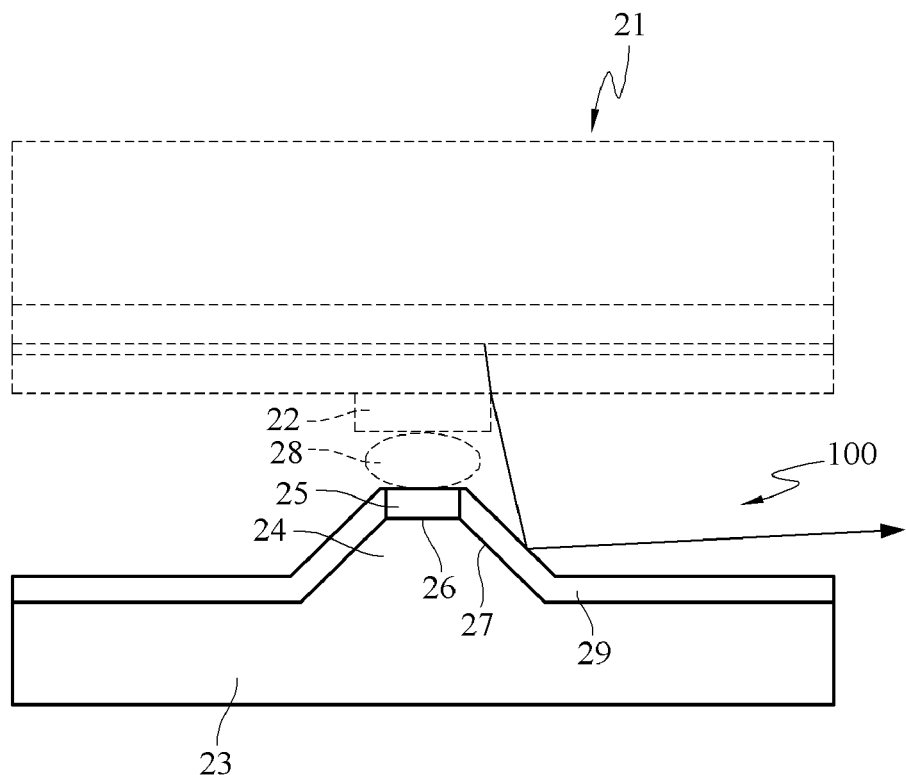
FIG. 2 is a schematic view of a first embodiment of the present invention.

Referring to FIG. 2, a schematic view of a first embodiment of the present invention is shown. An island submount 100 is provided for carrying a light-emitting element 21 having an electrical contact 22. The island submount 100 includes a substrate 23, an island structure 24, and a conductive layer 25.

The substrate 23 is made of a thermal conductive material, such as semiconductor, ceramic, or metal material.

The island structure 24 is formed on the substrate 23 and corresponding to the electrical contact 22 of the light-emitting element 21. The island structure 24 has a top surface 26 and an inclined surface 27.

The conductive layer 25 is covered on the top surface 26 of the island structure 24, for electrically connecting to the electrical contact 22 of the light-emitting element 21 corresponding to the island structure 24. The conductive layer 25 is electrically connected to the electrical contact 22 of the light-emitting element 21 through a connection layer 28. The connection layer 28 is made of an electrical conductive material. The conductive layer 25 is made of an electrical conductive material.

The island submount 100 of this embodiment further includes a reflective layer 29. The reflective layer 29 not only covers the inclined surface 27 of the island structure 24, but also covers the surface of the substrate 23, so as to appropriately reflect more lights. The reflective layer 29 is used to reflect and guide the light emerging from below the light-emitting element 21 carried by the island submount 100 to be emitted from the side. The reflective layer 29 is made of a reflective material.

Figure 3A:
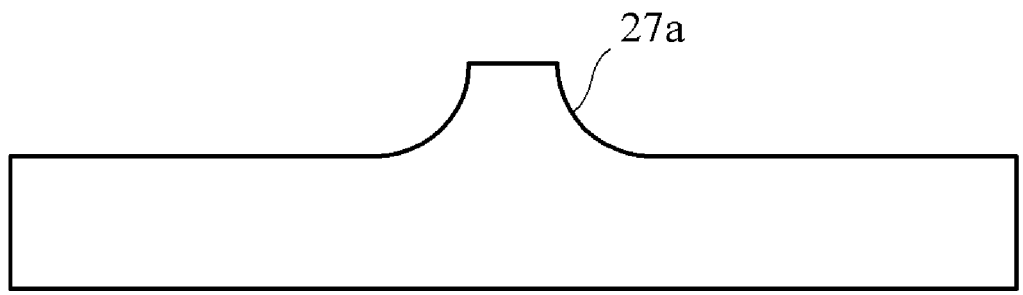
FIG. 3A is a schematic view of an inclined surface of an island structure according to the present invention.
Figure 3B:
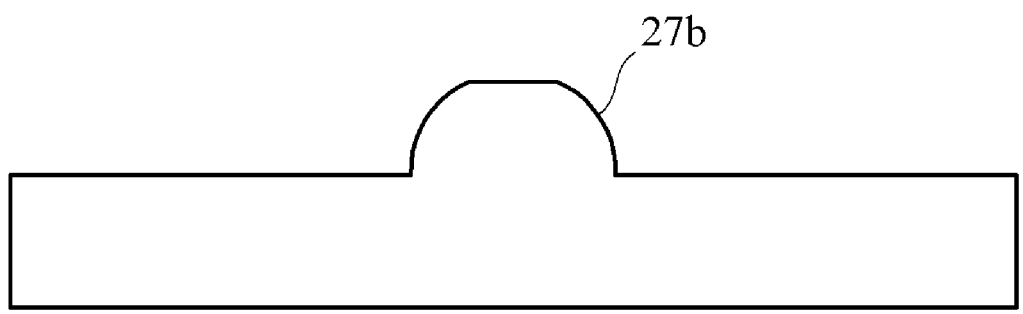
FIG. 3B is another schematic view of the inclined surface of an island structure according to the present invention.

The inclined surface 27 is a flat surface or a curved surface. Referring to FIGS. 3A and 3B, FIG. 3A is a schematic view of the inclined surface of the island structure according to the present invention, in which the inclined surface of the island structure is a concave curved surface 27a. FIG. 3B is a schematic view of the inclined surface of the island structure according to the present invention, in which the inclined surface of the island structure is a convex curved surface 27b.

Figure 4:
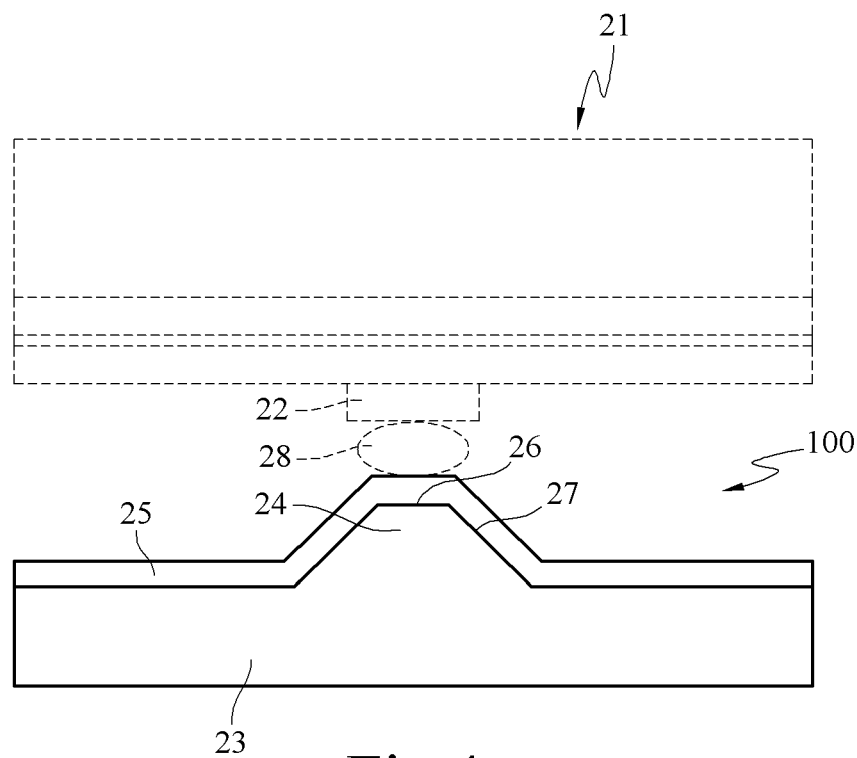
FIG. 4 is a schematic view of a second embodiment of the present invention.

FIG. 4 is a schematic view of a second embodiment of the present invention is shown. The structure of the island submount of this embodiment has been disclosed in the first embodiment, and the same parts can refer to the above description and will not be described herein again. This embodiment is characterized in that the conductive layer 25 is made of an electrically conductive and reflective material, such that the conductive layer 25 not only has excellent electrical conductivity, but also can effectively reflect the light. The conductive layer 25 is formed on the top surface 26 and the inclined surface 27 of the island structure 24, thus simplifying the fabricating processes of the reflective layer 29.

Figure 5:
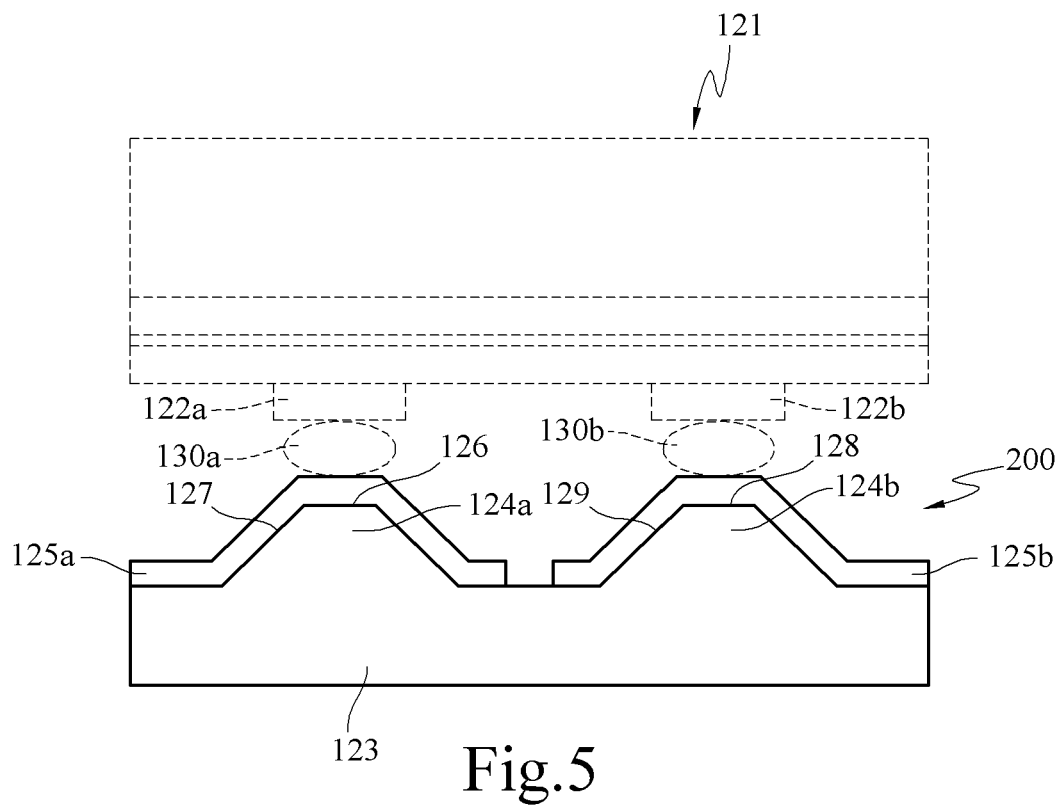
FIG. 5 is a schematic view of a third embodiment of the present invention.

Referring to FIG. 5, a schematic view of a third embodiment of the present invention is shown. An island submount 200 is provided for carrying a light-emitting element 121 having two electrical contacts 122a, 122b of opposite electrical properties. The island submount 200 includes a substrate 123, two island structures 124a, 124b, and two conductive layers 125a, 125b.

The substrate 123 is made of a thermal conductive material, such as semiconductor, ceramic, metal material, glass fiber, or bakelite.

The two island structures 124a, 124b are formed on the substrate 123. Each of the island structures is corresponding to an electrical contact of the light-emitting element. That is, the two island structures 124a, 124b are respectively corresponding to the two electrical contacts 122a, 122b of opposite electrical properties of the light-emitting element 121. The two island structures 124a, 124b respective have top surfaces 126, 128 and inclined surfaces 127, 129.

The two conductive layers 125a, 125b are made of an electrically conductive and reflective material. The two conductive layers 125a, 125b are respectively covered on the top surfaces 126, 128 and the inclined surfaces 127, 129 of the two island structures 124a, 124b. The two conductive layers 125a, 125b respectively covered on the top surfaces 126, 128 are electrically connected to the two electrical contacts 122a, 122b of opposite electrical properties. The two conductive layers 125a, 125b are electrically connected to the two electrical contacts 122a, 122b of opposite electrical properties through connection layers 130a, 130b. The connection layers 130a, 130b are made of an electrical conductive material. The two conductive layers 125a, 125b are disconnected between the two island structures 124a, 124b.

Figure 6:
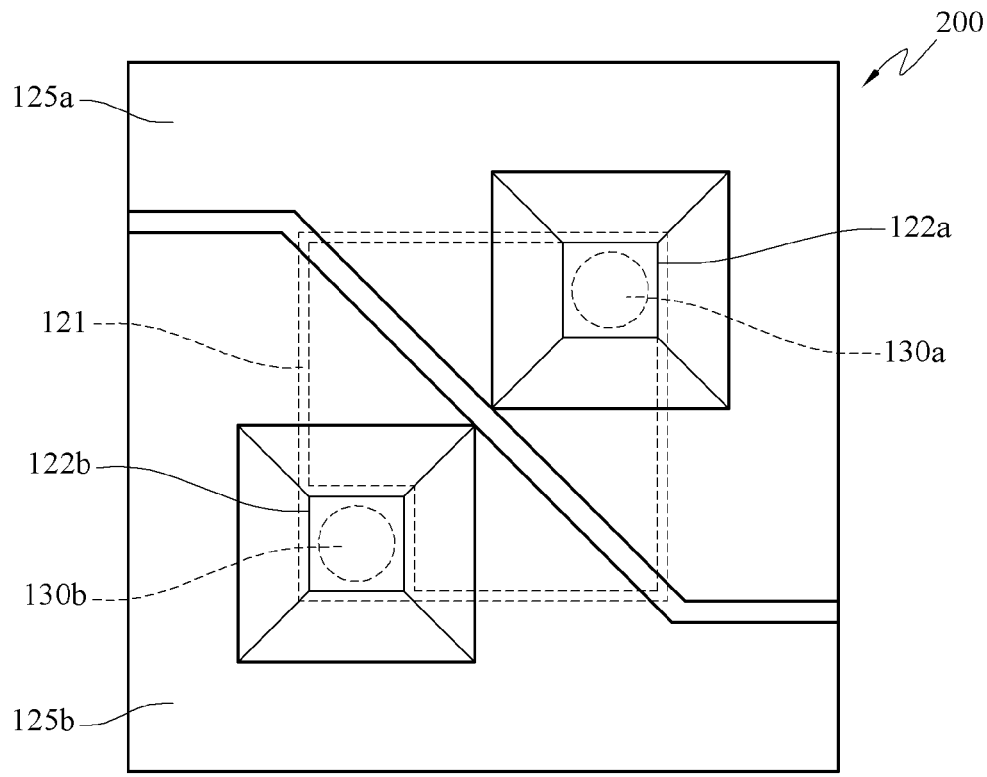
FIG. 6 is a top view of the third embodiment of the present invention.

The third embodiment of the present invention is disclosed above and is not intended to limit the number of the elements, such as the light-emitting element, the electrical contact, the conductive layer, and the island structure of the present invention. The number of the aforementioned elements may be one or more. Referring to FIG. 6, a top view of the third embodiment of the present invention is shown.

Figure 7:
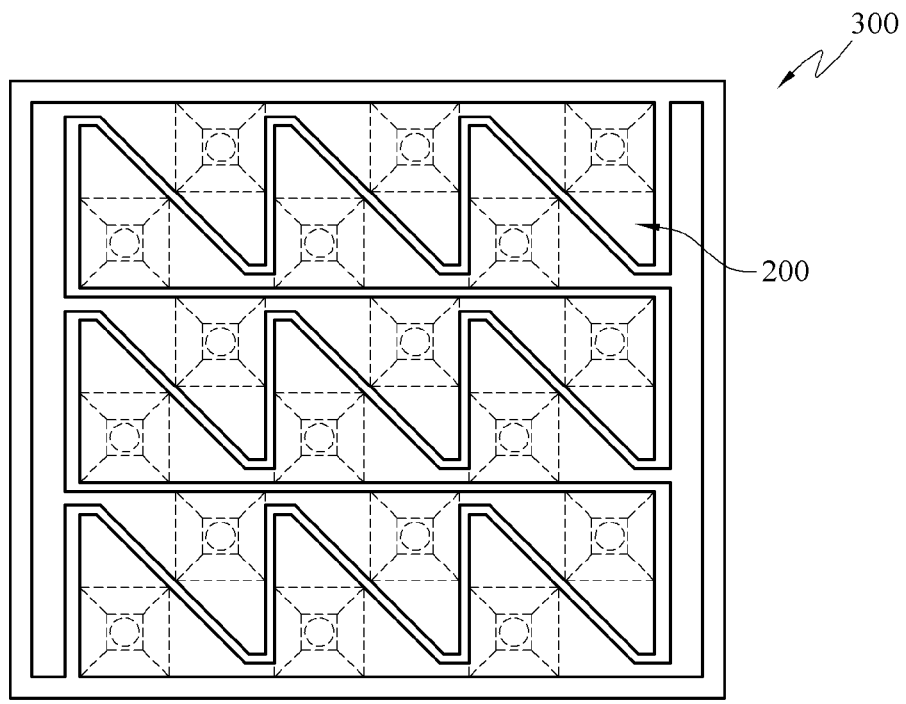
FIG. 7 is a schematic view of a fourth embodiment of the present invention.

Referring to FIG. 7, a schematic top view of a fourth embodiment of the present invention is shown. The island submount 300 of this embodiment is constituted by a plurality of island submounts 200 arranged in an array.

Figure 8:
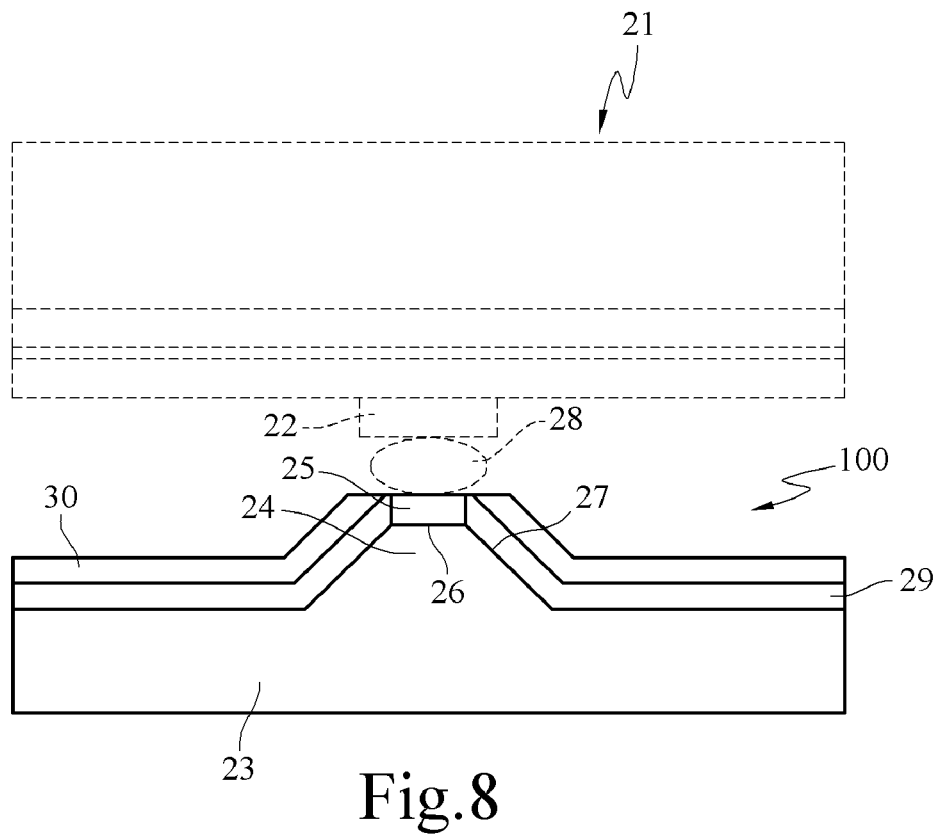
FIG. 8 is a schematic view of a fifth embodiment of the present invention.

Referring to FIG. 8, a schematic view of a fifth embodiment of the present invention is shown. The structure of the island submount of this embodiment has been disclosed in the first embodiment, and the same parts can refer to the above description and will not be described herein again. This embodiment is characterized in that the island submount 100 further includes a transparent protection layer 30 or a light-transmissive protection layer. The transparent protection layer 30 or the light-transmissive protection layer is covered on the reflective layer 29 corresponding to the inclined surface 27, for protecting the reflective layer 29 from being damaged by external forces. The transparent protection layer 30 or the light-transmissive protection layer is made of a transparent or light-transmissive insulating material that allows the light emerging from the light-emitting element 21 to pass through.

Figure 9:
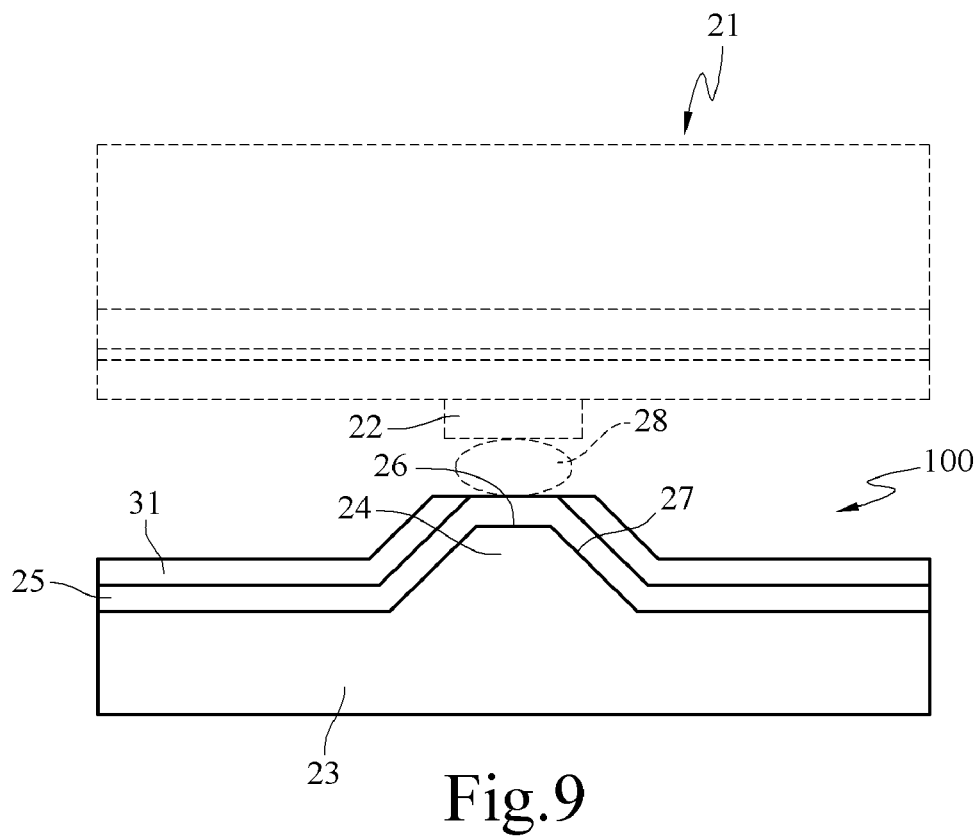
FIG. 9 is a schematic view of a sixth embodiment of the present invention.

Referring to FIG. 9, a schematic view of a sixth embodiment of the present invention is shown. The structure of the island submount of this embodiment has been disclosed in the second embodiment, and the same parts can refer to the above description and will not be described herein again. This embodiment is characterized in that the island submount 100 further includes a transparent protection layer 31 or a light-transmissive protection layer. The transparent protection layer 31 or the light-transmissive protection layer is covered on the reflective layer 25 corresponding to the inclined surface 27, for protecting the reflective layer 25 from being damaged by external forces. The transparent protection layer 31 or the light-transmissive protection layer is made of a transparent or light-transmissive insulating material that allows the light emerging from the light-emitting element 21 to pass through.

Figure 10:
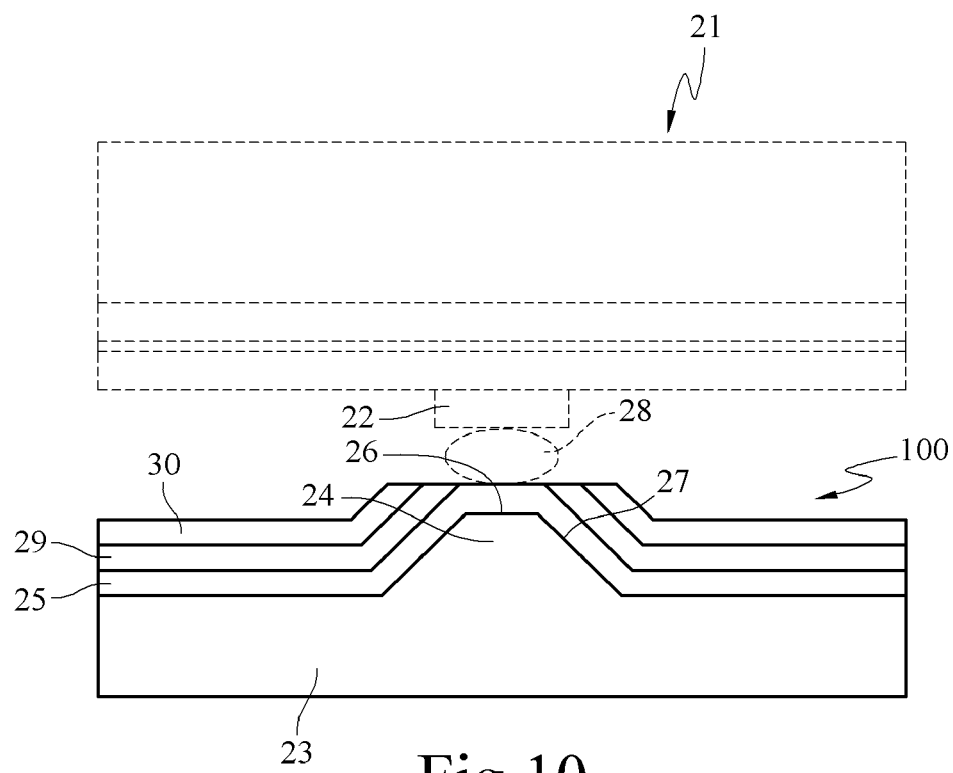
FIG. 10 is a schematic view of a seventh embodiment of the present invention.

Referring to FIG. 10, a schematic view of a seventh embodiment of the present invention is shown. The structure of the island submount of this embodiment has been disclosed in the fifth embodiment, and the same parts can refer to the above description and will not be described herein again. This embodiment is characterized in that the conductive layer 25 of the island submount 100 is further covered on the inclined surface 27.

Figure 11:
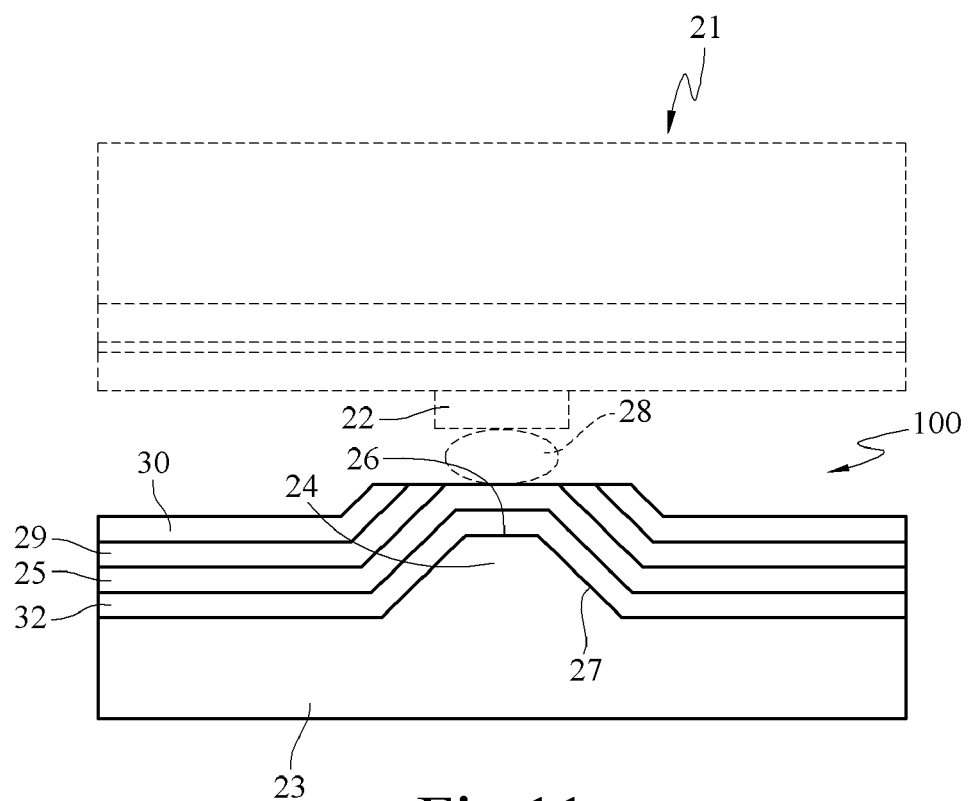
FIG. 11 is a schematic view of an eighth embodiment of the present invention.

Referring to FIG. 11, a schematic view of an eighth embodiment of the present invention is shown. The structure of the island submount of this embodiment has been disclosed in the seventh embodiment, and the same parts can refer to the above description and will not be described herein again. This embodiment is characterized in that the island submount 100 further includes an insulating layer 32 formed between the conductive layer 25 and the substrate 23.

Figure 12:
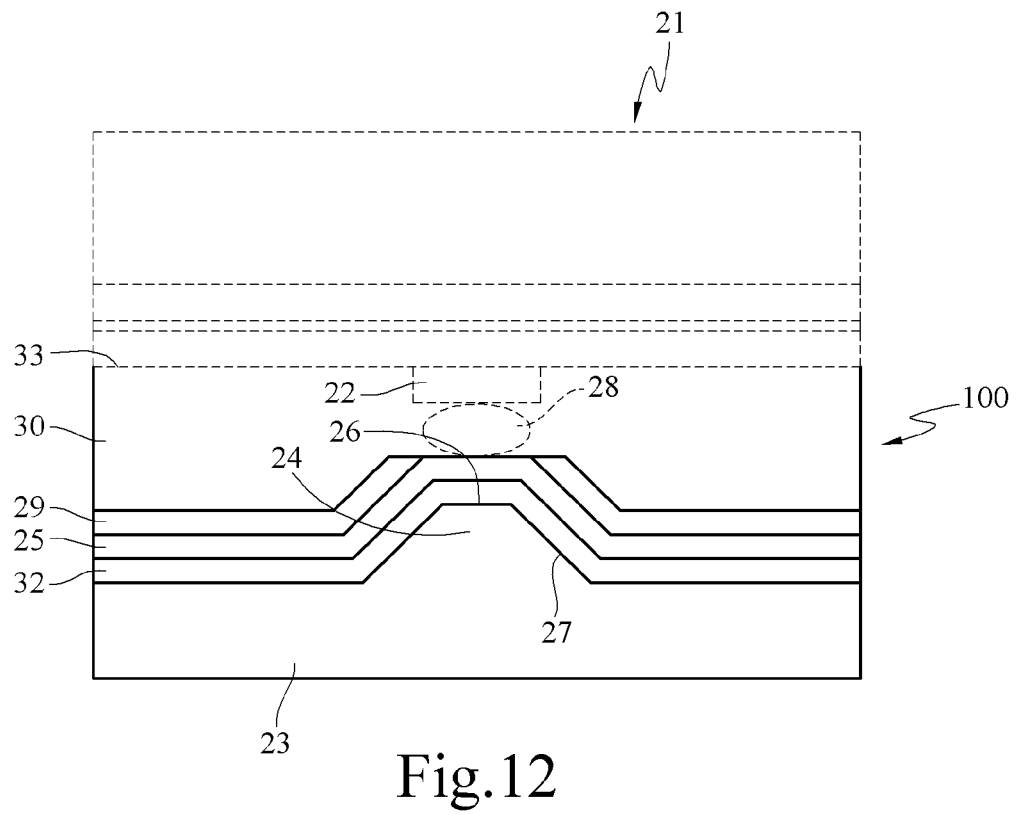
FIG. 12 is a schematic view of a ninth embodiment of the present invention.

Referring to FIG. 12, a schematic view of a ninth embodiment of the present invention is shown. The structure of the island submount of this embodiment has been disclosed in the eighth embodiment, and the same parts can refer to the above description and will not be described herein again. This embodiment is characterized in that the transparent protection layer 30 or the light-transmissive protection layer of the island submount 100 is covered on the reflective layer 29 corresponding to the inclined surface 27, and is at the same level of a light output plane 33 below the light-emitting element 21 carried by the island submount 100 of the present invention, for carrying the light-emitting element 21.

Figure 13:
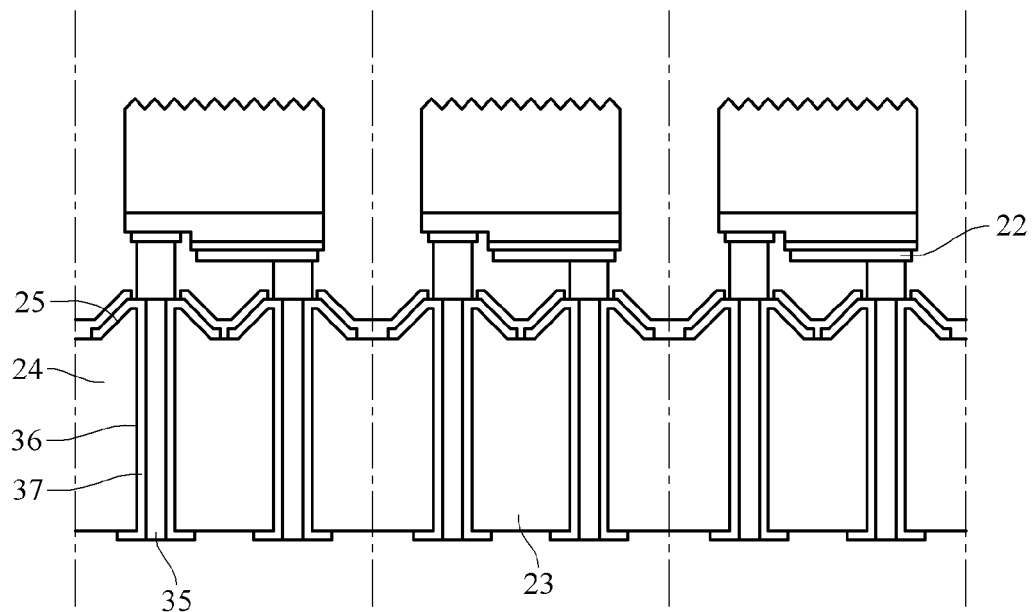
FIG. 13 is a schematic view of a tenth embodiment of the present invention.

Referring to FIG. 13, a schematic view of a tenth embodiment of the present invention is shown. The structure of the island submount of this embodiment has been disclosed in the eighth embodiment, and the same parts can refer to the above description and will not be described herein again. This embodiment is characterized in that the submount having the island structure 24 further includes a channel 35 penetrating from the top surface 26 of to the other side of the substrate 23 having the island structure 24. Besides, the channel 35 has an electrical conductive substance 37 on the inner side 36 thereof, and the electrical conductive substance 37 is electrically connected to the conductive layer 25, so as to electrically connect the electrical contact 22 to the other side of the substrate 23 having the island structure 24.

Figure 14:
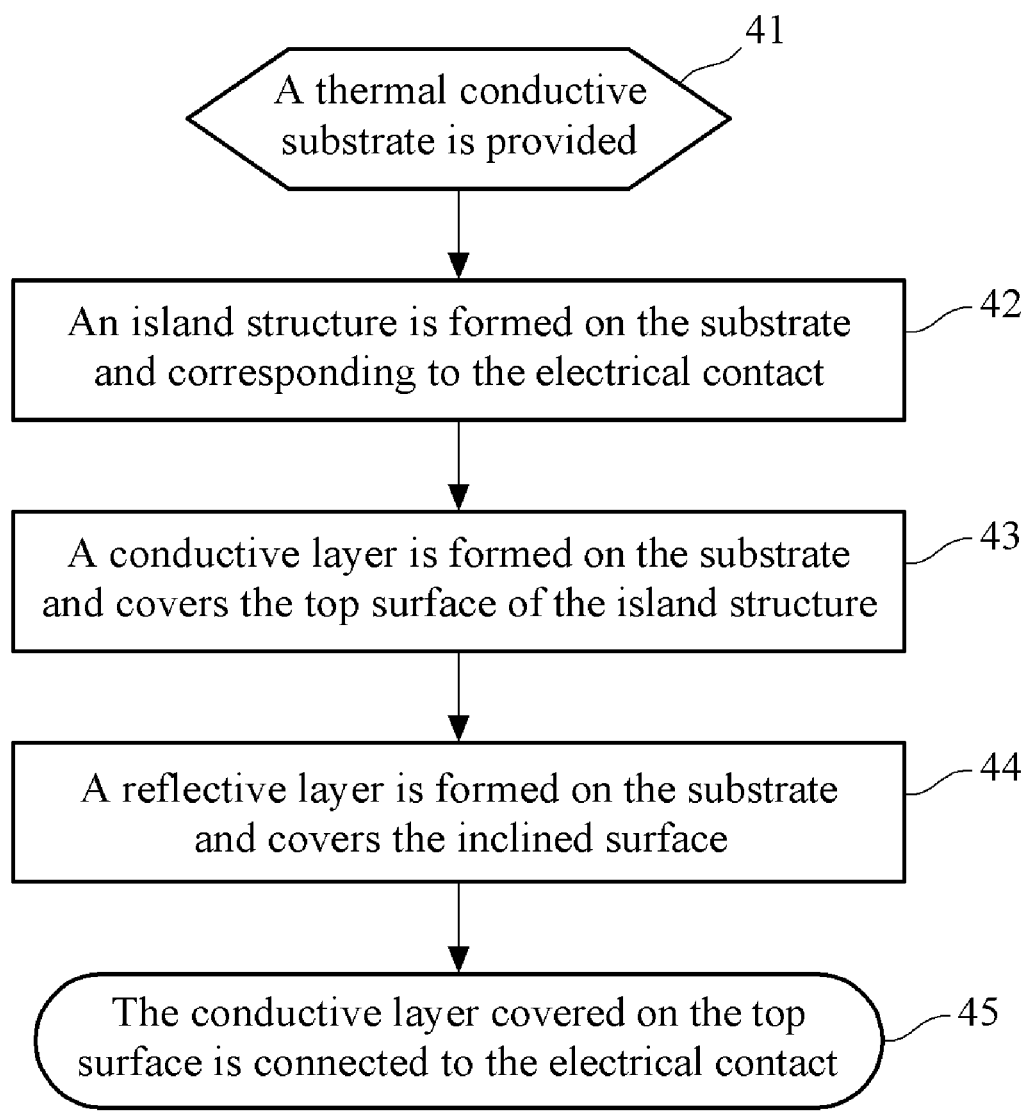
FIG. 14 is a flow chart of fabricating processes of the first embodiment of the present invention.

Referring to FIG. 14, a flow chart of fabricating processes of the first embodiment of the present invention is shown. A method for fabricating an island submount is provided, in which the island submount is used for carrying a light-emitting element having an electrical contact. The fabricating method includes the following steps. First, a thermal conductive substrate is provided (Step 41). An island structure having a top surface and an inclined surface is formed on the substrate and corresponding to the electrical contact (Step 42). A conductive layer is formed on the substrate, and the conductive layer covers the top surface of the island structure (Step 43). A reflective layer is formed on the substrate and covers the inclined surface (Step 44). The conductive layer covered on the top surface is connected to the electrical contact (Step 45).

Figure 15:
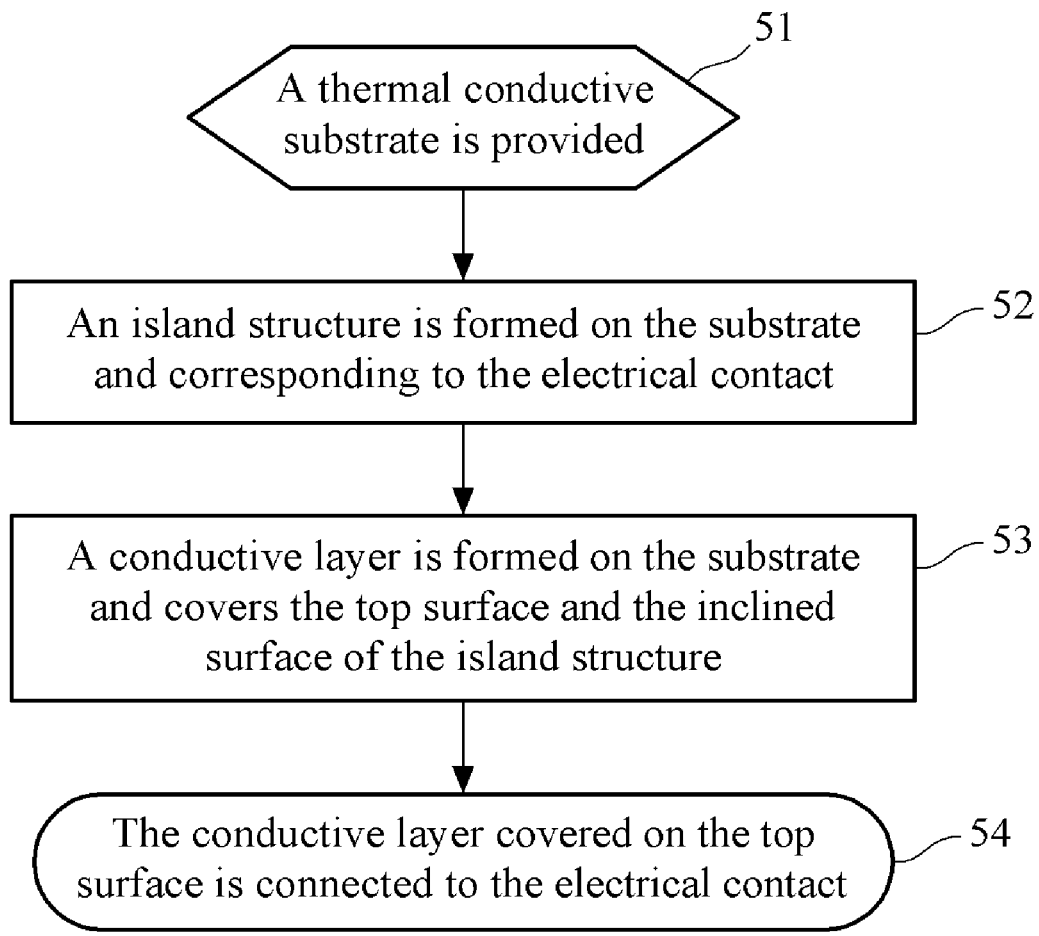
FIG. 15 is a flow chart of fabricating processes of the second embodiment of the present invention.

Referring to FIG. 15, a flow chart of fabricating processes of the second embodiment of the present invention is shown. A method for fabricating an island submount is provided, in which the island submount is used for carrying a light-emitting element having an electrical contact. The fabricating method includes the following steps. First, a thermal conductive substrate is provided (Step 51). An island structure having a top surface and an inclined surface is formed on the substrate and corresponding to the electrical contact (Step 52). A conductive layer is formed on the substrate and covers the top surface and the inclined surface of the island structure (Step 53). The conductive layer covered on the top surface is connected to the electrical contact (Step 54).

Figure 16:
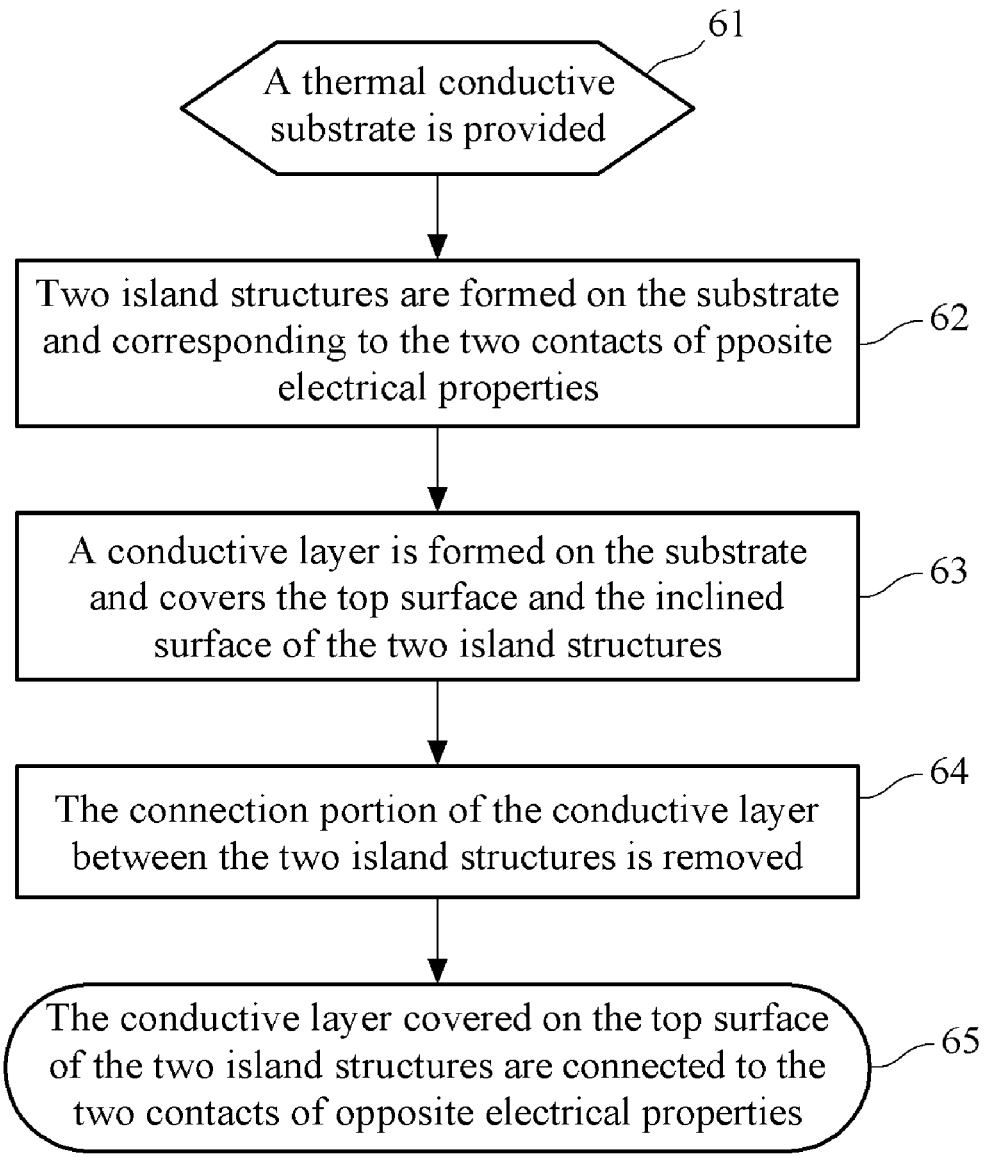
FIG. 16 is a flow chart of fabricating processes of the third embodiment of the present invention.

Referring to FIG. 16, a flow chart of fabricating processes of the third embodiment of the island submount of the present invention is shown. A method for fabricating an island submount is provided, in which the island submount is used for carrying a light-emitting element having two electrical contacts of opposite electrical properties. The fabricating method includes the following steps. First, a thermal conductive substrate is provided (Step 61). Two island structures having a top surface and an inclined surface are formed on the substrate and corresponding to the two contacts of opposite electrical properties (Step 62). A conductive layer is formed on the substrate and covers the top surface and the inclined surface of the two island structures (Step 63). The connection portion of the conductive layer between the two island structures is removed (Step 64). The conductive layer covered on the top surface of the two island structures is connected to the two contacts of opposite electrical properties (Step 65).

Figure 17:
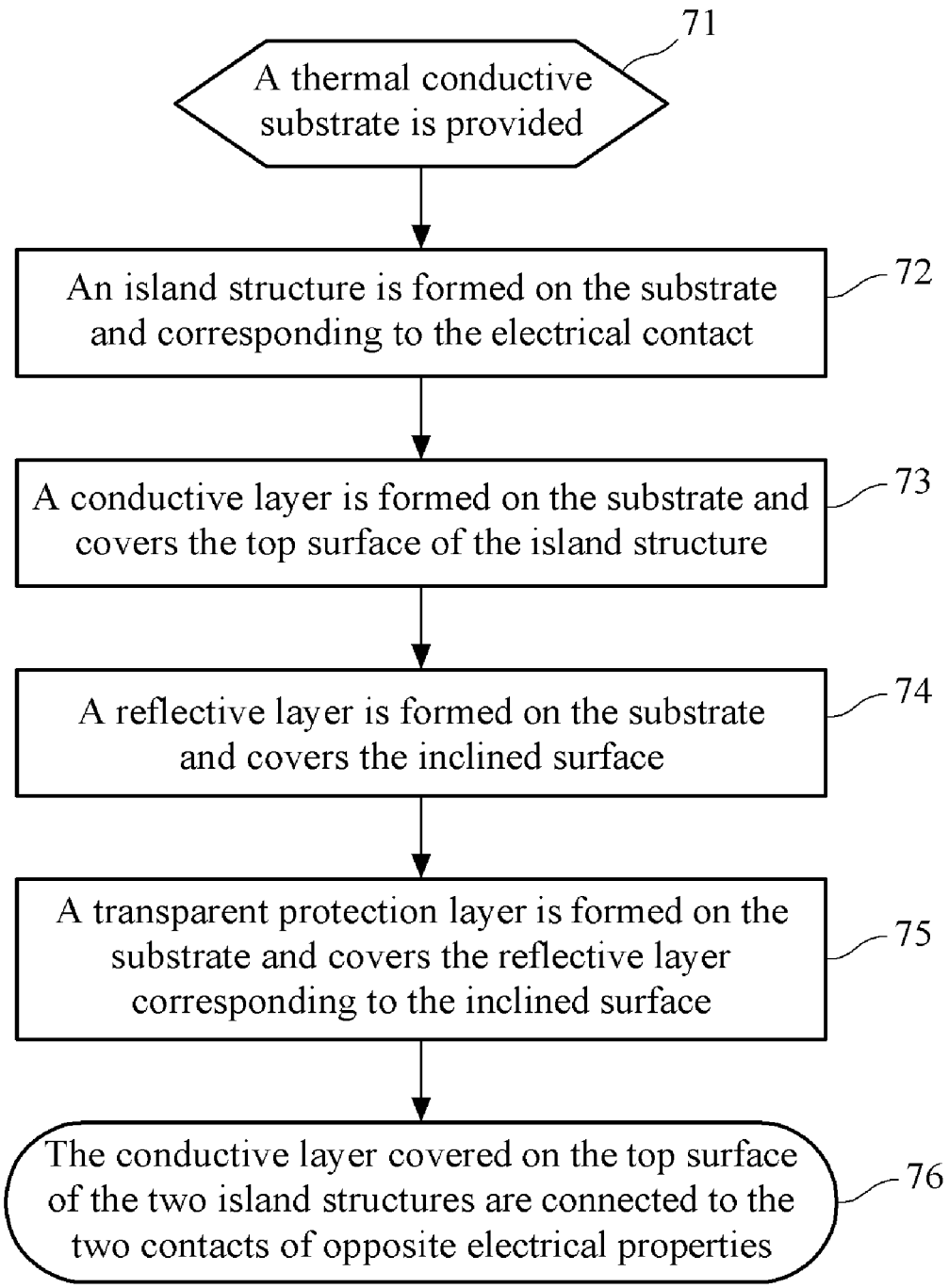
FIG. 17 is a flow chart of fabricating processes of the fifth embodiment of the present invention.

Referring to FIG. 17, a flow chart of fabricating processes of the fifth embodiment of the island submount of the present invention is shown. A method for fabricating an island submount is provided, in which the island submount is used for carrying a light-emitting element having an electrical contact. The fabricating method includes the following steps. First, a thermal conductive substrate is provided (Step 71). An island structure having a top surface and an inclined surface is formed on the substrate and corresponding to the electrical contact (Step 72). A conductive layer is formed on the substrate and covers the top surface of the island structure (Step 73). A reflective layer is formed on the substrate and covers the inclined surface (Step 74). A transparent protection layer or a light-transmissive protection layer is formed on the substrate and covers the reflective layer corresponding to the inclined surface (Step 75). The conductive layer covered on the top surface is connected to the electrical contact (Step 76).

Figure 18:
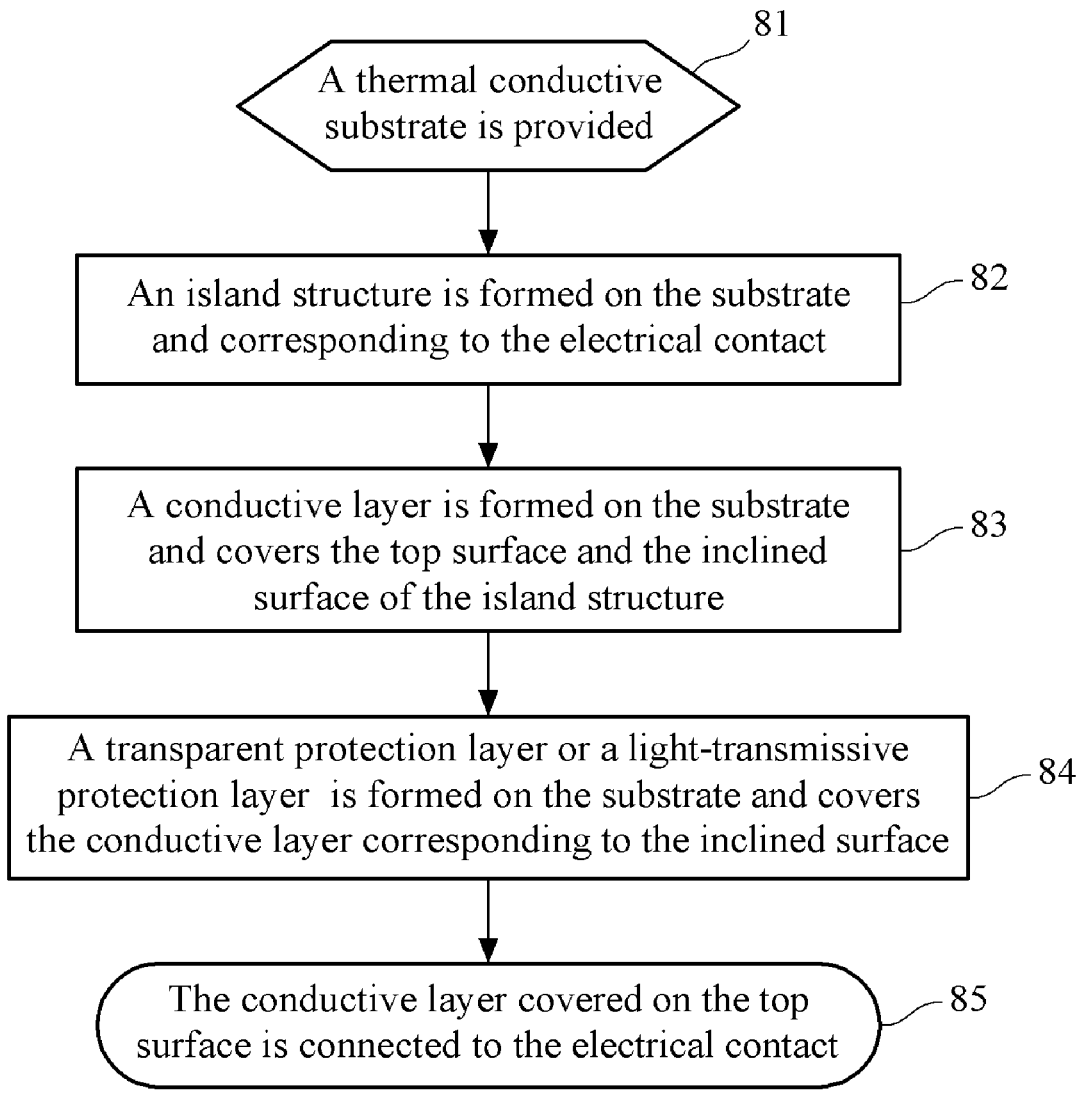
FIG. 18 is a flow chart of fabricating processes of the sixth embodiment of the present invention.

Referring to FIG. 18, a flow chart of fabricating processes of the sixth embodiment of the island submount of the present invention is shown. A method for fabricating an island submount is provided, in which the island submount is used for carrying a light-emitting element having an electrical contact. The fabricating method includes the following steps. First, a thermal conductive substrate is provided (Step 81). An island structure having a top surface and an inclined surface is formed on the substrate and corresponding to the electrical contact (Step 82). A conductive layer is formed on the substrate and covers the top surface and the inclined surface of the island structure (Step 83). A transparent protection layer or a light-transmissive protection layer is formed on the substrate and covers the conductive layer corresponding to the inclined surface (Step 84). The conductive layer covered on the top surface is connected to the electrical contact (Step 85).

Figure 19:
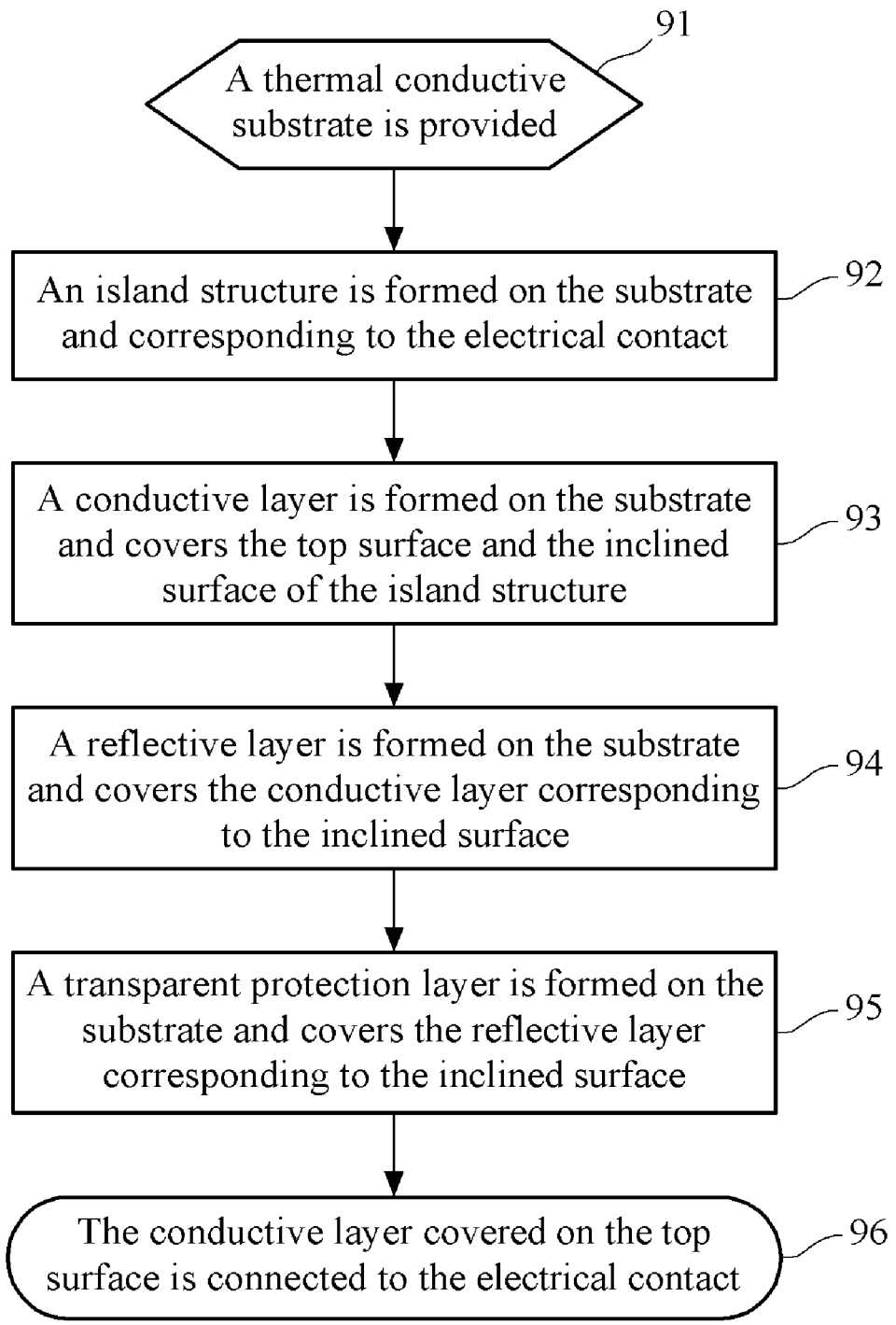
FIG. 19 is a flow chart of fabricating processes of the seventh embodiment of the present invention.

Referring to FIG. 19, a flow chart of fabricating processes of the seventh embodiment of the island submount of the present invention is shown. A method for fabricating an island submount is provided, in which the island submount is used for carrying a light-emitting element having an electrical contact. The fabricating method includes the following steps. First, a thermal conductive substrate is provided (Step 91). An island structure having a top surface and an inclined surface is formed on the substrate and corresponding to the electrical contact (Step 92). A conductive layer is formed on the substrate and covers the top surface and the inclined surface of the island structure (Step 93). A reflective layer is formed on the substrate and covers the conductive layer corresponding to the inclined surface (Step 94). A transparent protection layer or a light-transmissive protection layer is formed on the substrate and covers the reflective layer corresponding to the inclined surface (Step 95). The conductive layer covered on the top surface is connected to the electrical contact (Step 96).

Figure 20:
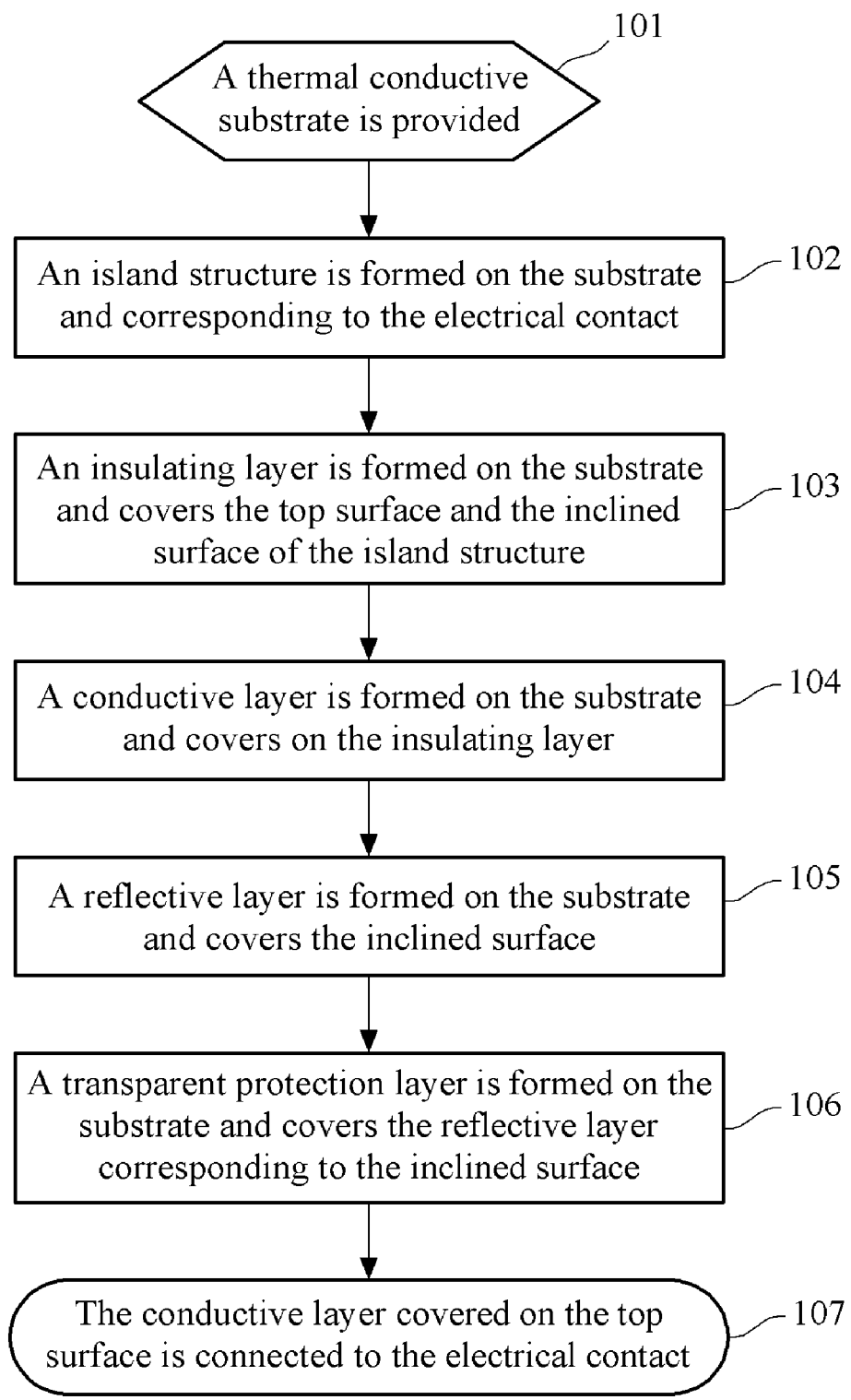
FIG. 20 is a flow chart of fabricating processes of the eighth embodiment of the present invention.

Referring to FIG. 20, a flow chart of fabricating processes of the eighth embodiment of the island submount of the present invention is shown. A method for fabricating an island submount is provided, in which the island submount is used for carrying a light-emitting element having an electrical contact. The fabricating method includes the following steps. First, a thermal conductive substrate is provided (Step 101). An island structure having a top surface and an inclined surface is formed on the substrate and corresponding to the electrical contact (Step 102). An insulating layer is formed on the substrate and covers the top surface and the inclined surface of the island structure (Step 103). A conductive layer is formed on the substrate and covers on the insulating layer (Step 104). A reflective layer is formed on the substrate and covers on the conductive layer corresponding to the inclined surface (Step 105). A transparent protection layer or a light-transmissive protection layer is formed on the substrate and covers the reflective layer corresponding to the inclined surface (Step 106). The conductive layer covered on the top surface is connected to the electrical contact (Step 107).

Figure 21:
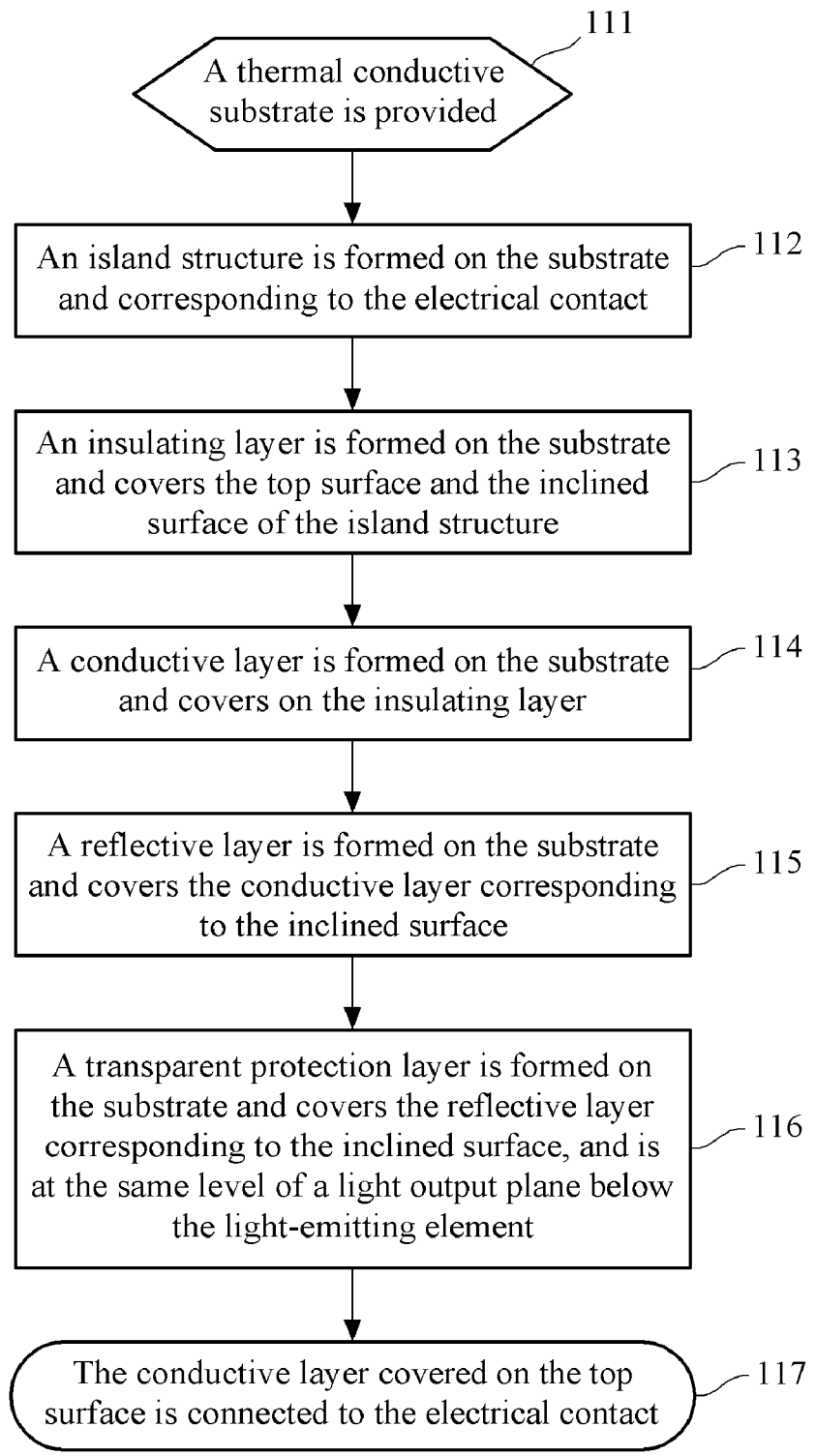
FIG. 21 is a flow chart of fabricating processes of the ninth embodiment of the present invention.

Referring to FIG. 21, a flow chart of fabricating processes of the ninth embodiment of the island submount of the present invention is shown. A method for fabricating an island submount is provided, in which the island submount is used for carrying a light-emitting element having an electrical contact. The fabricating method includes the following steps. First, a thermal conductive substrate is provided (Step 111). An island structure having a top surface and an inclined surface is formed on the substrate and corresponding to the electrical contact (Step 112). An insulating layer is formed on the substrate and covers the top surface and the inclined surface of the island structure (Step 113). A conductive layer is formed on the substrate and covers on the insulating layer (Step 114). A reflective layer is formed on the substrate and covers the conductive layer corresponding to the inclined surface (Step 115). A transparent protection layer or a light-transmissive protection layer is formed on the substrate and covers the reflective layer corresponding to the inclined surface, and is at the same level of a light output plane below the light-emitting element (Step 116). The conductive layer covered on the top surface is connected to the electrical contact (Step 117).

Figure 22:
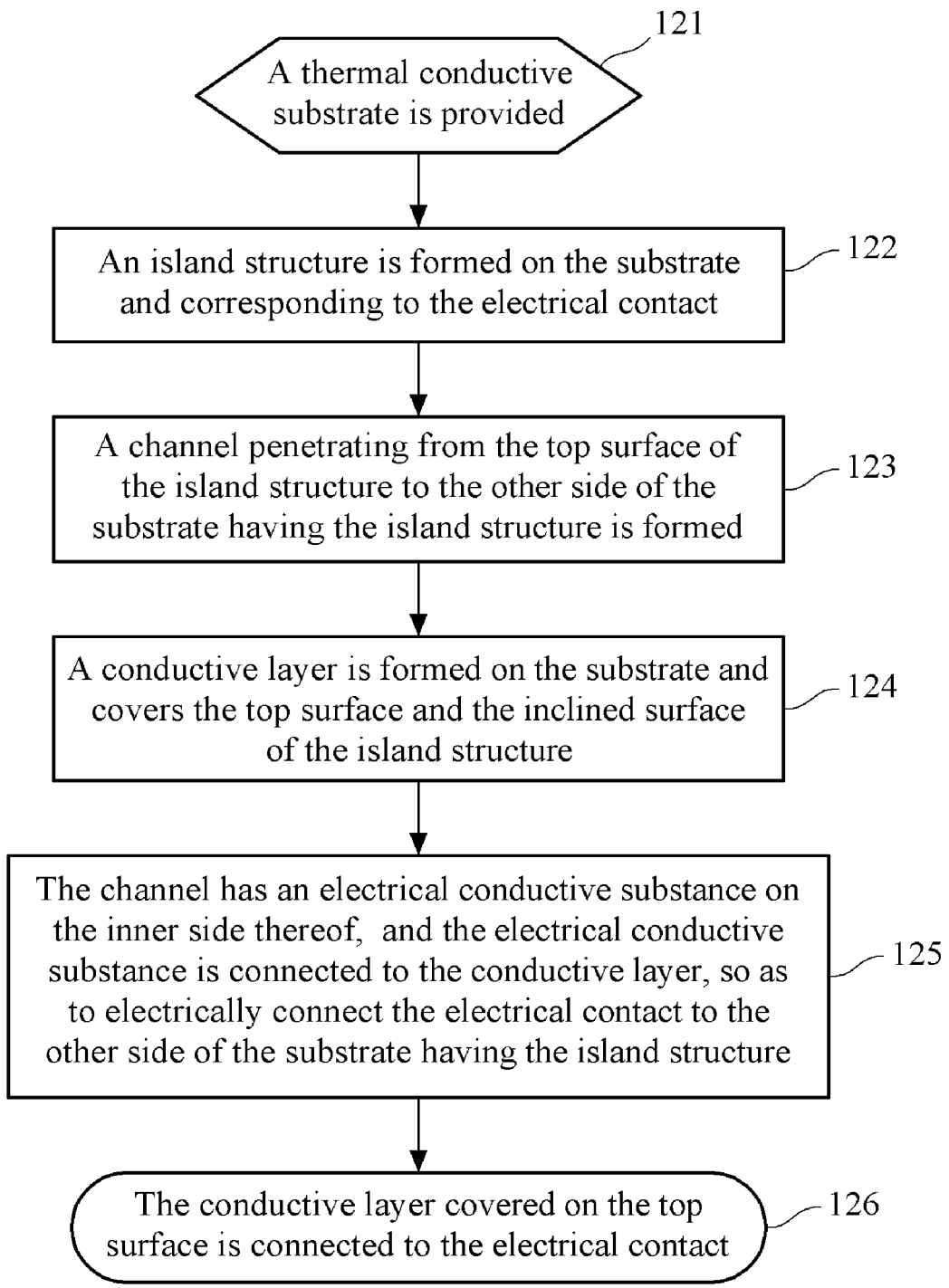
FIG. 22 is a flow chart of fabricating processes of the tenth embodiment of the present invention.

Referring to FIG. 22, a flow chart of fabricating processes of the tenth embodiment of the island submount of the present invention is shown. A method for fabricating an island submount is provided, in which the island submount is used for carrying a light-emitting element having an electrical contact. The fabricating method includes the following steps. First, a thermal conductive substrate is provided (Step 121). An island structure having a top surface and an inclined surface is formed on the substrate and corresponding to the electrical contact (Step 122). A channel penetrating from the top surface of the island structure to the other side of the substrate having the island structure is formed (Step 123). A conductive layer is formed on the substrate and covers the top surface and the inclined surface of the island structure (Step 124). The channel has an electrical conductive substance on the inner side thereof, and the electrical conductive substance is connected to the conductive layer, so as to electrically connect the electrical contact to the other side of the substrate having the island structure (Step 125). The conductive layer covered on the top surface is connected to the electrical contact (Step 126).

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light emitting device comprising: a substrate; at least one two-island structure having two separate island structures and located on the substrate, each of the two separate island structures of the at least one two-island structure having a top surface and an inclined surface; a conductive layer, disposed on the substrate and at least covering the top surface and an inclined surface of each of the two separate island structures; and a light emitting element having at least two electrical contacts of opposite electrical properties which are each electrically connected with the conductive layer, and the light emitting element having a bottom surface facing the two-island structure, wherein the bottom surface of the light emitting element extends across the inclined surfaces and the top surfaces of the two separate island structures, each of the two separate island structures of the two-island structure corresponds to one of the two electrical contacts, respectively, and the conductive layers is disconnected between the two separate island structures of the two island structure.

2. The light emitting device as claimed in claim 1, wherein the inclined surface is a flat surface.

3. The light emitting device as claimed in claim 1, wherein the inclined surface is a curved surface.

4. The light emitting device as claimed in claim 1, further comprising a channel penetrating from the top surface of the island structure to the other side of the substrate, and wherein the channel has an electrical conductive substance connected to the conductive layer on an inner side thereof, so as to electrically connect the electrical contact to the other side of the substrate.

5. The light emitting device as claimed in claim 1, further comprising a reflective layer covering the inclined surface and a surface of the substrate having the island structure.

6. The light emitting device as claimed in claim 1, wherein the conductive layer further covers the inclined surface and a surface of the substrate having the island structure.

7. The light emitting device as claimed in claim 5, further comprising a transparent protection layer covering the reflective layer corresponding to the inclined surface and the surface of the substrate having the island structure, and wherein the transparent protection layer is capable of allowing the light emitted by the light-emitting element to pass through.

8. The light emitting device as claimed in claim 6, further comprising an insulating layer disposed between the conductive layer and the substrate.

9. The light emitting device as claimed in claim 6, further comprising a transparent protection layer covering the conductive layer corresponding to the inclined surface and the surface of the substrate having the island structure, and wherein the transparent protection layer is capable of allowing the light emitted by the light-emitting element to pass through.

10. The light emitting device as claimed in claim 8, further comprising a reflective layer covering the conductive layer corresponding to the inclined surface and the surface of the substrate having the island structure.

11. The light emitting device as claimed in claim 10, further comprising a transparent protection layer covering the reflective layer corresponding to the inclined surface and the surface of the substrate having the island structure, and wherein the transparent protection layer is provided for the light emitted by the light-emitting element to pass through.

12. The light emitting device as claimed in claim 11, wherein the transparent protection layer is at the same level of a light output plane below the light-emitting element, for carrying the light-emitting element.

13. A method for fabricating a light emitting device, comprising: providing a substrate; forming at least one two-island structure having two separate island structures, each of the island structures of the at least one two-island structure having a top surface and an inclined surface; forming conductive layers on the substrate, wherein the conductive layers at least covers the top surface and inclined surface of each of the two separate island structures; and covering a light emitting element having at least two electrical contacts of opposite electrical properties, the light emitting element covering over the inclined surfaces and the top surfaces of the two separate island structures, connecting the conductive layers to the electrical contacts of the light emitting element, where each of the two separate island structures of the two-island structure corresponds to one of the two electrical contacts of opposite electrical properties, and the conductive layers are disconnected between the two separate island structures of the two-island structure.

14. The method for fabricating the light emitting device as claimed in claim 13, further comprising forming a reflective layer after the step of forming at least one conductive layer, wherein the reflective layer covers both the inclined surface and a surface of the substrate having the island structure.

15. The method for fabricating the light emitting device as claimed in claim 14, further comprising forming a transparent protection layer after the step of forming a conductive layer, wherein the transparent protection layer covers the reflective layer corresponding to the inclined surface and the surface of the substrate having the island structure.

16. The method for fabricating the light emitting device as claimed in claim 13, wherein the conductive layer covers both the inclined surface and a surface of the substrate having the island structure.

17. The method for fabricating the light emitting device as claimed in claim 16, further comprising forming a transparent protection layer after the step of forming a conductive layer, wherein the transparent protection layer covers both the conductive layer corresponding to the inclined surface and the surface of the substrate having the island structure.

18. The method for fabricating the light emitting device as claimed in claim 16, further comprising forming an insulating layer before the step of forming a conductive layer, wherein the insulating layer is disposed between the island structure and the conductive layer.

19. The method for fabricating the light emitting device as claimed in claim 18, further comprising forming a reflective layer after the step of forming a conductive layer, wherein the reflective layer covers both the conductive layer corresponding to the inclined surface and the surface of the substrate having the island structure.

20. The method for fabricating the light emitting device as claimed in claim 19, further comprising forming a transparent protection layer after the step of forming a reflective layer, wherein the transparent protection layer covers both the reflective layer corresponding to the inclined surface and the surface of the substrate having the island structure.

21. The method for fabricating the light emitting device as claimed in claim 20, wherein the transparent protection layer is at the same level of the conductive layer on the top surface, for carrying the light-emitting element.

22. The method for fabricating the light emitting device as claimed in claim 13, after the step of forming at least one island structure, further comprises forming a channel penetrating from the top surface of the island structure to the opposite side of the substrate from the island structure, wherein the channel has an electrical conductive substance on an inner side thereof, and wherein the electrical conductive substance electronically connects the electrical contact to the other side of the substrate.

23. A light emitting device, comprising: a substrate; a two-island structure located on the substrate, each of the island structures of the two-island structure having a top surface and an inclined surface; two conductive layers, each conductive layer covering the top surface and inclined surface of each of the island structures, respectively; and
    a light emitting element including two electrical contacts of opposite electrical properties, where one of the two electrical contacts is located on the top surface of one island structure of the two-island structure and the other one of the two electrical contacts is located on the top surface of the other one island structure of the two-island structure, with the two electrical contacts are respectively in contact with the conductive layers on the top surfaces.

24. A method for fabricating a light emitting device, comprising:
    providing a substrate; forming a two-island structure on the substrate, each of the island structures of the two-island structure having a top surface and an inclined surface;
    forming two conductive layers on the top surface and inclined surface of each of the island structures, respectively; and disposing the light-emitting element on the top surfaces, the light emitting element including two electrical contacts, where each one of the two electrical contacts is located on a top surface of the two island structures, so as to connect the conductive layers disposed on the top surfaces.

25. A light-emitting element array, including:

a substrate; multiple island structures located on the substrate, each of the island structures having a top surface and an inclined surface; multiple conductive layers, which cover each of the top surfaces and inclined surfaces of the multiple island structures, respectively; and multiple light-emitting elements each being located on the top surfaces of at least two of the multiple island structures, where each of the multiple light emitting elements including two electrical contacts, each of which is connected to one top surface of the at least two of the multiple island structures so as to connect the conductive layers of the at least two multiple island structures.

* * * * *